(12) United States Patent
Takagishi et al.

(10) Patent No.: US 8,446,691 B2
(45) Date of Patent: May 21, 2013

(54) MAGNETIC RECORDING DEVICE

(75) Inventors: Masayuki Takagishi, Tokyo (JP); Hitoshi Iwasaki, Tokyo (JP); Kenichiro Yamada, Tokyo (JP); Katsuhiko Koui, Kanagawa-ken (JP); Tomomi Funayama, Tokyo (JP); Masahiro Takashita, Kanagawa-ken (JP); Mariko Kitazaki, Kanagawa-ken (JP); Soichi Oikawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/459,610

(22) Filed: Apr. 30, 2012

(65) Prior Publication Data

US 2012/0275061 A1 Nov. 1, 2012

Related U.S. Application Data

(63) Continuation of application No. PCT/JP2009/005806, filed on Oct. 30, 2009.

(51) Int. Cl.
*G11B 5/127* (2006.01)

(52) U.S. Cl.
USPC ..................................... 360/125.3

(58) Field of Classification Search
USPC .............................. 360/125.03, 125.16, 125.3
See application file for complete search history.

(56) References Cited

U.S. PATENT DOCUMENTS

| | | | |
|---|---|---|---|
| 6,433,958 B1 * | 8/2002 | Matsukawa et al. | 360/119.04 |
| 6,519,119 B1 * | 2/2003 | van der Heijden et al. | 360/324 |
| 7,957,098 B2 | 6/2011 | Yamada et al. | |
| 8,081,397 B2 * | 12/2011 | Funayama et al. | 360/125.08 |
| 8,300,346 B2 * | 10/2012 | Ikeda et al. | 360/59 |
| 8,363,355 B2 * | 1/2013 | Mochizuki et al. | 360/125.3 |
| 2001/0017746 A1 | 8/2001 | Nishida et al. | |
| 2004/0070869 A1 | 4/2004 | Nishida et al. | |
| 2004/0145828 A1 | 7/2004 | Im | |
| 2008/0112087 A1 | 5/2008 | Clinton et al. | |
| 2008/0208733 A1 | 8/2008 | Robb et al. | |

(Continued)

FOREIGN PATENT DOCUMENTS

| | | |
|---|---|---|
| JP | 2001-243602 | 9/2001 |
| JP | 2004-234830 | 8/2004 |
| JP | 2008-123669 | 5/2008 |
| JP | 2009-70439 | 4/2009 |

OTHER PUBLICATIONS

International Search Report for PCT/JP2009/005806 mailed Dec. 1, 2009.
Y. Tang et al., "Narrow Track Confinement by AC Field Generation Layer in Microwave Assisted Magnetic Recording", IEEE Transactions of Magnetics, vol. 44, Issue 11, Nov. 2008, pp. 3376-3379.

(Continued)

*Primary Examiner* — Angel Castro
(74) *Attorney, Agent, or Firm* — Nixon & Vanderhye, P.C.

(57) ABSTRACT

According to one embodiment, a magnetic recording device includes a magnetic recording head and a magnetic recording medium. The magnetic recording head includes a main magnetic pole, a shield and a stacked structure. The main magnetic pole has a medium facing surface and a main magnetic pole side surface. The shield has a shield side surface. The stacked structure is provided between the main magnetic pole and shield, and includes first and second magnetic layers, and an intermediate layer. The magnetic recording medium includes a backing layer and a magnetic recording layer. A distance between an end portion of the medium facing surface on a side of the stacked structure and the backing layer is twice or more of a distance between the main magnetic pole side surface and the shield side surface.

20 Claims, 10 Drawing Sheets

U.S. PATENT DOCUMENTS

| | | |
|---|---|---|
| 2009/0052095 A1 | 2/2009 | Yamada et al. |
| 2009/0059423 A1 | 3/2009 | Yamada et al. |
| 2010/0007996 A1 | 1/2010 | Iwasaki et al. |
| 2010/0195247 A1* | 8/2010 | Mochizuki et al. ...... 360/123.01 |

OTHER PUBLICATIONS

U.S. Appl. No. 12/457,657, Iwasaki et al., filed Jun. 17, 2009.
U.S. Appl. No. 12/155,329, Yamada et al., filed Jun. 2, 2008.

* cited by examiner

MAGNETIC RECORDING DEVICE

CROSS-REFERENCE TO RELATED APPLICATIONS

This is a continuation application of International Application PCT/JP2009/005806, filed on Oct. 30, 2009; the entire contents of which are incorporated herein by reference.

FIELD

Embodiments described herein relate generally to a magnetic recording device.

BACKGROUND

In order to increase the density of a magnetic recording device, the radio frequency magnetic field assisted recording scheme using a spin torque oscillator has been proposed. In this scheme, a radio frequency magnetic field is generated by the spin torque oscillator and used to locally decrease the coercivity of the magnetic recording medium. This enables magnetic recording on the magnetic recording medium having high coercivity and high magnetic anisotropy energy. Hence, thermal fluctuations are suppressed, and the recording density can be increased.

In order to increase the SN ratio of magnetic recording/reproduction, it is desired to optimize the magnetic field generated in the main magnetic pole of the magnetic recording head. However, there is a limit to optimization by improving the design of the magnetic recording head.

Conventionally, in order to increase the efficiency of the magnetic circuit to improve the writing characteristic, the distance between the main magnetic pole and the backing layer of the magnetic recording medium is designed to be as small as possible. For instance, in Non-Patent Document 1 (IEEE TRANSACTIONS ON MAGNETICS, Volume 44, Issue 11, November 2008 PP. 3376-3379, "Narrow Track Confinement by AC Field Generation Layer in Microwave Assisted Magnetic Recording" by Yuhui Tang and Jian-Gang Zhu), the distance between the main magnetic pole and the backing layer is 35-40 nm. Within the spirit of such conventional designs, there is a limit to the increase of the SN ratio of magnetic recording/reproduction.

DETAILED DESCRIPTION

Figure 1:
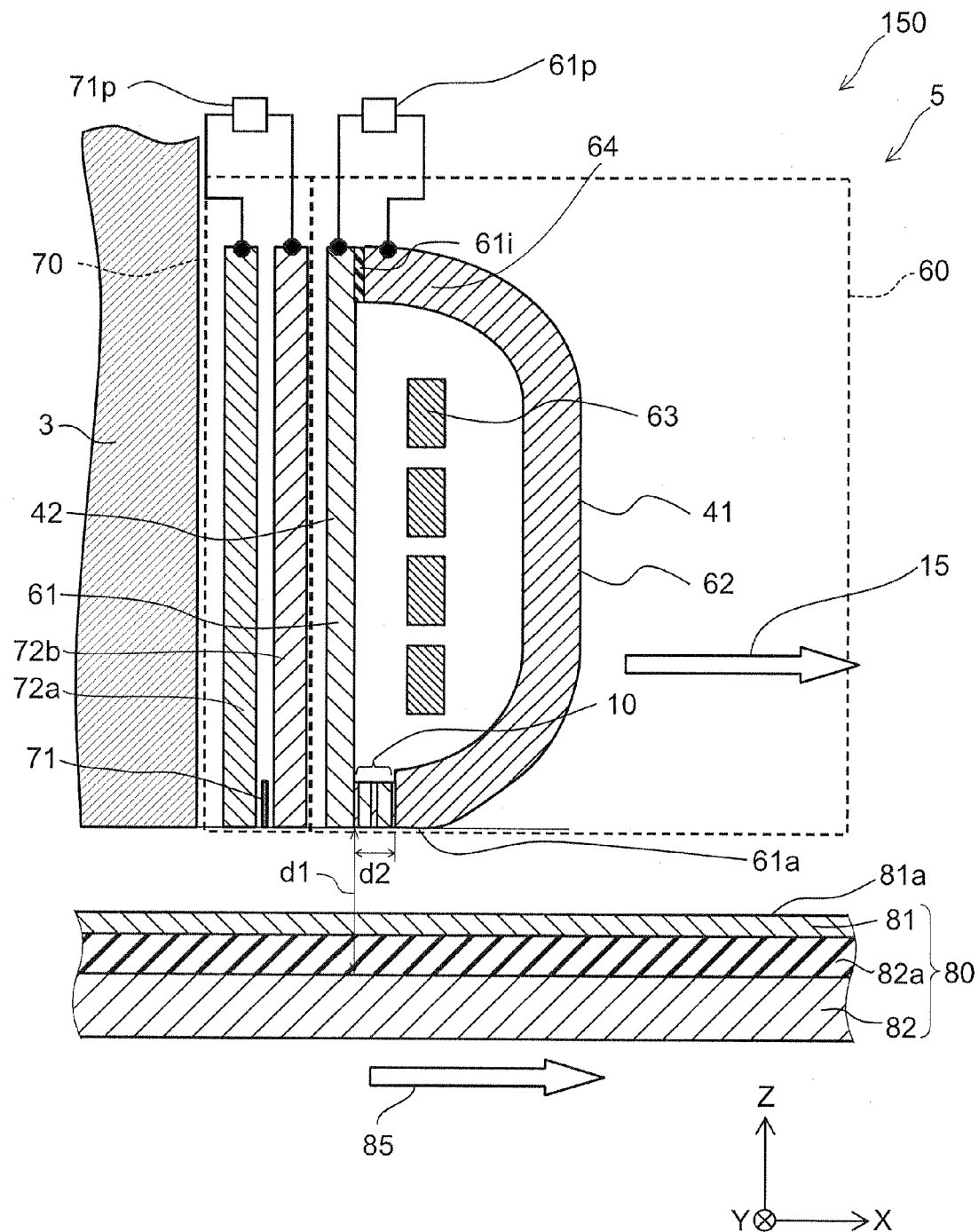
FIG. 1 is a schematic view illustrating a magnetic recording device.

According to one embodiment, a magnetic recording device includes a magnetic recording head and a magnetic recording medium. The magnetic recording head includes a main magnetic pole, a shield and a stacked structure. The main magnetic pole has a medium facing surface and a main magnetic pole side surface intersecting the medium facing surface, includes a soft magnetic material, and is configured to generate a recording magnetic field. The shield has a shield side surface facing the main magnetic pole side surface. The stacked structure is provided between the main magnetic pole and the shield. The stacked structure includes a first magnetic layer, a second magnetic layer, and an intermediate layer provided between the first magnetic layer and the second magnetic layer and including a nonmagnetic material. The magnetic recording medium includes a backing layer and a magnetic recording layer. The backing layer includes a soft magnetic material and forms a magnetic circuit together with the main magnetic pole and the shield. The magnetic recording layer is provided between the backing layer and the magnetic recording head. The magnetic recording layer has a major surface. The major surface faces the medium facing surface and the shield. The magnetic recording layer is subjected to perpendicular magnetic recording by the recording magnetic field. A first distance along a direction perpendicular to the major surface between an end portion of the medium facing surface on a side of the stacked structure and the backing layer is twice or more of a second distance along a direction perpendicular to the main magnetic pole side surface between the main magnetic pole side surface and the shield side surface.

Various embodiments will be described hereinafter in detail with reference to the accompanying drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the present specification and the drawings, components similar to those described previously with reference to earlier figures are labeled with like reference numerals, and the detailed description thereof is omitted appropriately.

Embodiment

FIG. 1 is a schematic view illustrating the configuration of a magnetic recording device according to the embodiment.

Figure 2:
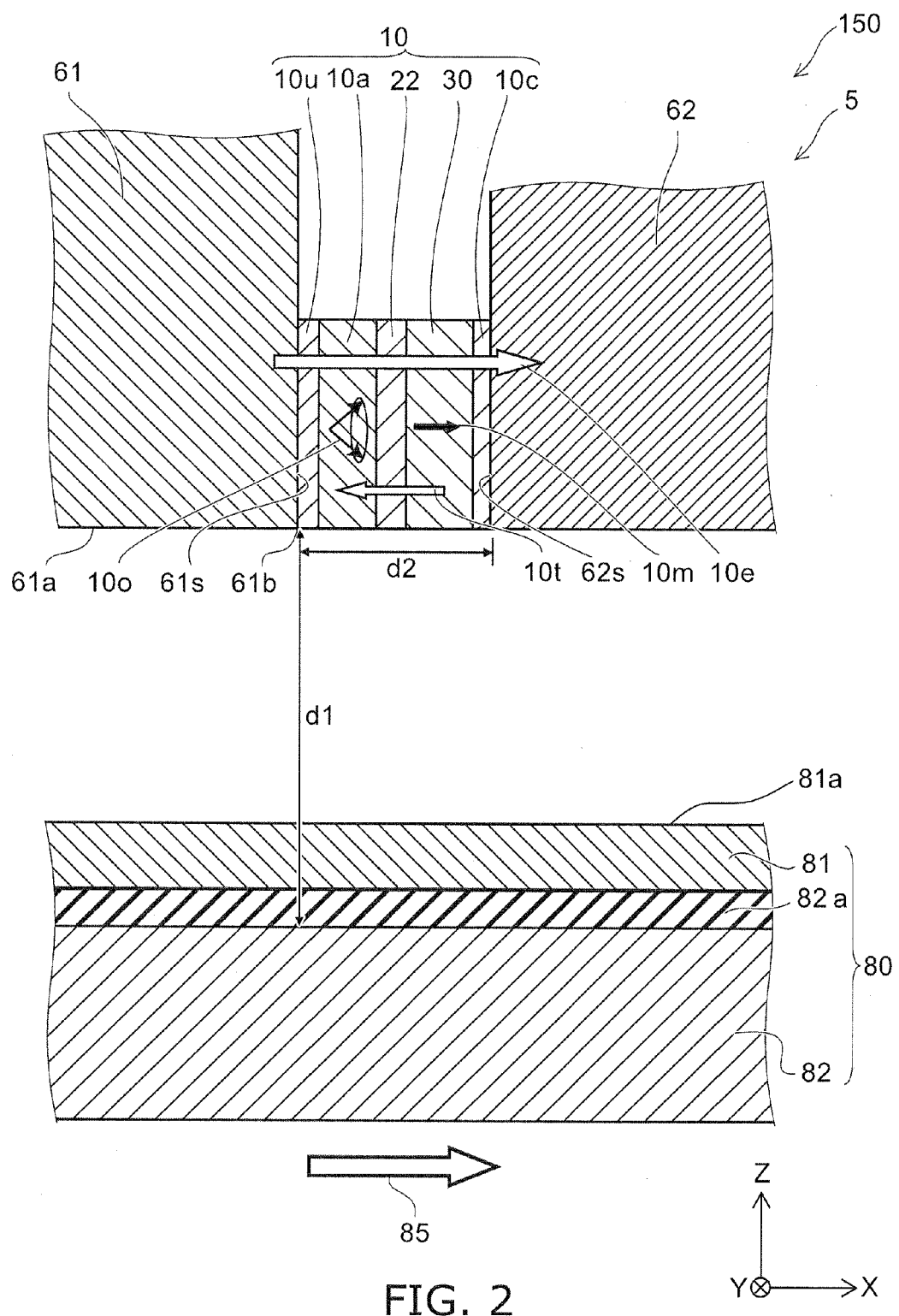
FIG. 2 is a schematic view illustrating the main part of the magnetic recording device.

FIG. 2 is a schematic view illustrating the main part configuration of the magnetic recording device according to the embodiment.

As shown in FIG. 1 and FIG. 2, the magnetic recording device 150 according to the embodiment includes a magnetic recording medium 80 and a magnetic recording head 5.

The magnetic recording head 5 is provided opposed to the magnetic recording medium 80. The magnetic recording medium 80 includes a magnetic recording layer 81 and a backing layer 82. The magnetic recording layer 81 is opposed to the magnetic recording head 5.

Here, the direction perpendicular to the surface (major surface 81a) of the magnetic recording layer 81 opposed to the magnetic recording head 5 is defined as Z-axis direction. One direction perpendicular to the Z-axis direction is defined as X-axis direction. The direction perpendicular to the Z-axis direction and the X-axis direction is defined as Y-axis direction. Here, as described later, the magnetic recording medium 80 can be shaped like e.g. a disk. Along the circumference of the magnetic recording medium 80, the relative position between the magnetic recording medium 80 and the magnetic recording head 5 is changed. The aforementioned X-Y-Z coordinate system can be defined in a short distance range around the magnetic recording head 5. Here, the direction from the magnetic recording head 5 toward the magnetic recording medium 80 is directed along the Z-axis direction.

For instance, the magnetic recording medium 80 moves relative to the magnetic recording head 5 along the direction perpendicular to the Z-axis direction. By the magnetic recording head 5, magnetization at each position of the magnetic recording layer 81 of the magnetic recording medium 80 is controlled, and magnetic recording is performed. The moving direction of the magnetic recording medium 80 is referred to as medium moving direction 85. The medium moving direction 85 is aligned with e.g. the X-axis direction. Here, the relative movement between the magnetic recording medium 80 and the magnetic recording head 5 may be performed by the movement of the magnetic recording head 5. The magnetic recording medium 80 and the magnetic recording head 5 only need to undergo relative movement along the direction perpendicular to the Z-axis direction.

The magnetic recording head 5 is installed on the head slider 3 described later. By the function of the head slider 3, the magnetic recording head 5 is held with spacing from the magnetic recording medium 80.

The magnetic recording head 5 includes a writing head section 60. The writing head section 60 includes a main magnetic pole 61, a shield 62, and a spin torque oscillator 10 (stacked structure).

That is, the magnetic recording head 5 includes a main magnetic pole 61, a shield 62, and a spin torque oscillator 10 (stacked structure).

The main magnetic pole 61 is provided opposed to the magnetic recording medium 80, includes a soft magnetic material, and applies a recording magnetic field to the magnetic recording medium 80. The shield 62 is provided opposed to the magnetic recording medium 80. The shield 62 is opposed also to the main magnetic pole 61. The spin torque oscillator 10 is provided between the main magnetic pole 61 and the shield 62.

The main magnetic pole 61 includes a medium facing surface (air bearing surface) 61a opposed to the magnetic recording medium 80, and a main magnetic pole side surface 61s opposed to the spin torque oscillator 10 (stacked structure). The main magnetic pole side surface 61s intersects the medium facing surface 61a. The shield 62 includes a shield side surface 62s opposed to the spin torque oscillator 10 (stacked structure). That is, the shield side surface 62s is opposed to the main magnetic pole side surface 61s. An opposing state includes a state having another component being interposed in addition to a directly opposing state.

In the specific example, the shield 62 is provided on the trailing side of the main magnetic pole 61. Specifically, the shield 62 is provided ahead of the medium moving direction 85 as viewed from the main magnetic pole 61. In the direction perpendicular to the Z-axis direction, a particular position of the magnetic recording medium 80 is first opposed to the main magnetic pole 61, and then opposed to the shield 62. By providing the shield 62 on the trailing side of the main magnetic pole 61, the magnetization change (magnetization transition) in the trailing side end portion of the recorded region can be made steep in the magnetic recording medium 80. The magnetic recording medium 80 moves toward this steep transition. Hence, the steep magnetization transition remains as final recording without overwriting. Thus, adoption of this configuration enables radio frequency magnetic field assisted recording with higher linear recording density.

In the back gap section 64 of the main magnetic pole 61 and the shield 62 on the side opposite to the side opposed to the magnetic recording medium 80, an insulating layer 61i is provided between the main magnetic pole 61 and the shield 62. Thus, the main magnetic pole 61 and the shield 62 are electrically isolated from each other.

The stacking direction 15 of the main magnetic pole 61, the spin torque oscillator 10, and the shield 62 is aligned with e.g. the X-axis direction. However, the stacking direction 15 of the main magnetic pole 61, the spin torque oscillator 10, and the shield 62 does not necessarily need to be perpendicular to the Z-axis direction. That is, the stacking direction 15 may be inclined from the X-axis direction.

The spin torque oscillator 10 includes an oscillation layer 10a (first magnetic layer), a spin injection layer 30 (second magnetic layer), and an intermediate layer 22. The intermediate layer 22 is provided between the oscillation layer 10a and the spin injection layer 30, and includes a nonmagnetic material.

To the spin torque oscillator 10, a magnetic field is applied from the main magnetic pole 61. Thus, the spin torque oscillator 10 functions as a spin torque oscillator.

The product of the anisotropy energy constant of the oscillation layer 10a and the volume of the oscillation layer 10a is set smaller than the product of the anisotropy energy of the spin injection layer 30 and the volume of the spin injection layer 30.

For instance, in the case where the volume of the oscillation layer 10a and the volume of the spin injection layer 30 are equal, the coercivity of the oscillation layer 10a is smaller than that of the spin injection layer 30.

Furthermore, preferably, the coercivity of the oscillation layer 10a is set smaller than the magnetic field (gap magnetic field Hgap) applied from the main magnetic pole 61, and the coercivity of the spin injection layer 30 is set smaller than the magnetic field applied from the main magnetic pole 61. Then, the magnetization direction of the spin injection layer 30 and the direction of the magnetic field applied from the main magnetic pole 61 are made generally parallel. As a result, the magnetic field applied from the main magnetic pole 61 to the oscillation layer 10a and the spin torque applied from the spin injection layer 30 to the oscillation layer 10a are always balanced independently of the direction of the magnetic field applied from the main magnetic pole 61. Thus, stable oscillation can be realized. This enables stable radio frequency magnetic field assisted recording in both cases where the main magnetic pole 61 records "0" and "1" on the magnetic recording medium 80.

If a DC current is passed in the oscillation layer 10a, the intermediate layer 22, and the spin injection layer 30, then the spin torque generated by the spin injection layer 30 causes ferromagnetic resonance in the magnetization of the oscillation layer 10a. That is, the electron flow direction 10e resulting from the DC current is directed from the oscillation layer 10a toward the spin injection layer 30. The magnetization direction 10m of the spin injection layer 30 is generally parallel to the electron flow direction 10e. The spin torque in the spin injection layer 30 is transferred to the direction opposite to the electron flow direction 10e. Thus, the spin torque flow 10t is directed from the spin injection layer 30 toward the oscillation layer 10a. This spin torque causes the magnetization 10o to oscillate in the oscillation layer 10a. As a result, a radio frequency magnetic field is generated from the spin torque oscillator 10.

Here, the aforementioned DC current is supplied by an oscillator excitation power supply 61p connected to the spin torque oscillator 10 through the main magnetic pole 61 and the shield 62. That is, the main magnetic pole 61 and the shield function as an electrode 41 and an electrode 42 for supplying a current to the spin torque oscillator 10.

In the specific example, the spin torque oscillator 10 further includes a foundation layer 10u provided on the opposite side of the oscillation layer 10a from the intermediate layer 22, and a capping layer 10c provided on the opposite side of the spin injection layer 30 from the intermediate layer 22. The oscillation layer 10a is disposed between the intermediate layer 22 and the foundation layer 10u. The spin injection layer 30 is disposed between the intermediate layer 22 and the capping layer 10c. The spin torque oscillator 10 is fabricated by sequentially stacking e.g. the foundation layer 10u, the oscillation layer 10a, the intermediate layer 22, the spin injection layer 30, and the capping layer 10c in this order on a layer constituting the main magnetic pole 61. The foundation layer 10u serves as a growth nucleus layer for forming the oscillation layer 10a.

In the specific example shown in FIG. 2, the oscillation layer 10a is placed on the main magnetic pole 61 side, and the spin injection layer 30 is placed on the shield 62 side. However, the embodiment is not limited thereto. The oscillation layer 10a may be placed on the shield 62 side, and the spin injection layer 30 may be placed on the main magnetic pole 61 side.

The stacking direction of the oscillation layer 10a, the intermediate layer 22, and the spin injection layer 30 in the spin torque oscillator 10 may be either identical to or different from the stacking direction 15 of the main magnetic pole 61, the spin torque oscillator 10, and the shield 62.

In the specific example, the stacking direction of the oscillation layer 10a, the intermediate layer 22, and the spin injection layer 30 in the spin torque oscillator 10 is perpendicular to the Z-axis direction. However, the stacking direction of the oscillation layer 10a, the intermediate layer 22, and the spin injection layer 30 in the spin torque oscillator 10 may be inclined with respect to the direction perpendicular to the Z-axis direction.

The size of the spin torque oscillator 10 is e.g. approximately several ten nm (nanometers). The generated radio frequency magnetic field is localized in the range of approximately several ten nm around the spin torque oscillator 10. By the in-plane component of the radio frequency magnetic field, the perpendicularly magnetized magnetic recording layer 81 can be efficiently resonated. Thus, the coercivity of the magnetic recording layer 81 can be significantly decreased. As a result, high density magnetic recording is performed only in the overlapping portion of the recording magnetic field produced by the main magnetic pole 61 (recording magnetic field Hm) and the radio frequency magnetic field produced by the spin torque oscillator 10. Thus, the magnetic recording layer 81 can be made of a magnetic recording material with high coercivity (Hc) and high magnetic anisotropy energy (Ku). Hence, thermal fluctuations in high density recording are suppressed.

Furthermore, the writing head section 60 of the magnetic recording head 5 includes a main magnetic pole excitation coil 63 for exciting the main magnetic pole 61.

The magnetic recording head 5 can further include a reproducing head section 70. The reproducing head section 70 includes a first magnetic shield layer 72a, a second magnetic shield layer 72b, and a magnetic reproducing element 71 provided between the first magnetic shield layer 72a and the second magnetic shield layer 72b. The magnetic reproducing element 71 can be based on e.g. a GMR element or a TMR (tunnel magnetoresistive effect) element. Through the first magnetic shield layer 72a and the second magnetic shield layer 72b, a voltage is applied from a reproducing element bias power supply 71p to the magnetic reproducing element 71. Thus, the magnetization direction of the magnetic recording layer 81 is read, and the information recorded on the magnetic recording medium 80 is read.

The magnetic recording head 5 includes a medium facing surface 61a opposed to the magnetic recording medium 80. In the specific example, the heights of the respective surfaces of the main magnetic pole 61, the spin torque oscillator 10, and the shield 62 opposed to the magnetic recording medium 80 are equal to each other as viewed from the magnetic recording medium 80. However, the embodiment is not limited thereto. That is, the heights of the respective surfaces of the main magnetic pole 61, the spin torque oscillator 10, and the shield 62 opposed to the magnetic recording medium 80 may be different from each other as viewed from the magnetic recording medium 80. Inclusive of this case, the surface of the main magnetic pole 61 opposed to the magnetic recording medium 80 is referred to as medium facing surface 61a. That is, the main magnetic pole 61 includes a medium facing surface 61a opposed to the magnetic recording medium 80.

The components of the aforementioned reproducing head section 70 are isolated from the components of the aforementioned writing head section 60 by insulator such as alumina, not shown.

The magnetic recording medium 80 includes a magnetic recording layer 81 and a backing layer 82.

The magnetic recording layer 81 is provided opposed to the medium facing surface 61a of the magnetic recording head 5. That is, the magnetic recording layer 81 includes a major surface 81a opposed to the magnetic recording head. The magnetic recording layer 81 undergoes perpendicular magnetic recording by the recording magnetic field applied from the main magnetic pole 61.

The backing layer 82 is provided on the opposite side of the magnetic recording layer 81 from the magnetic recording head 5. In the specific example, a seed layer 82a is provided between the magnetic recording layer 81 and the backing layer 82. For instance, the seed layer 82a is formed on the backing layer 82, and the magnetic recording layer 81 is formed on the seed layer 82a. Thus, the magnetic recording medium 80 is formed.

The backing layer 82 includes a soft magnetic material. The backing layer 82 forms a magnetic circuit together with the main magnetic pole 61 and the shield 62 of the magnetic recording head 5.

In the magnetic recording device 150 according to the embodiment, a first distance (backing layer distance d1) between the medium facing surface 61a of the magnetic recording head 5 and the backing layer 82 of the magnetic recording medium 80 is set to twice or more a second distance (magnetic recording head gap d2) between the main magnetic pole 61 and the shield 62 of the magnetic recording head 5.

The backing layer distance d1 is the distance along the Z-axis direction (the direction perpendicular to the major surface 81a of the magnetic recording layer 81 opposed to the magnetic recording head 5) between the backing layer 82 and the end portion 61*b* of the medium facing surface 61*a* on the side opposed to the spin torque oscillator 10.

The magnetic recording head gap d2 is the distance along the direction perpendicular to the main magnetic pole side surface 61*s* between the main magnetic pole side surface 61*s* of the main magnetic pole 61 opposed to the spin torque oscillator 10 and the shield side surface 62*s* of the shield 62 opposed to the spin torque oscillator 10.

Thus, the backing layer distance d1 is set to twice or more the magnetic recording head gap d2. As described below, this enables magnetic recording/reproduction of the radio frequency magnetic field assisted recording scheme with high SN ratio.

In the following, the characteristic of the magnetic recording device 150 according to the embodiment is described.

Figure 3:
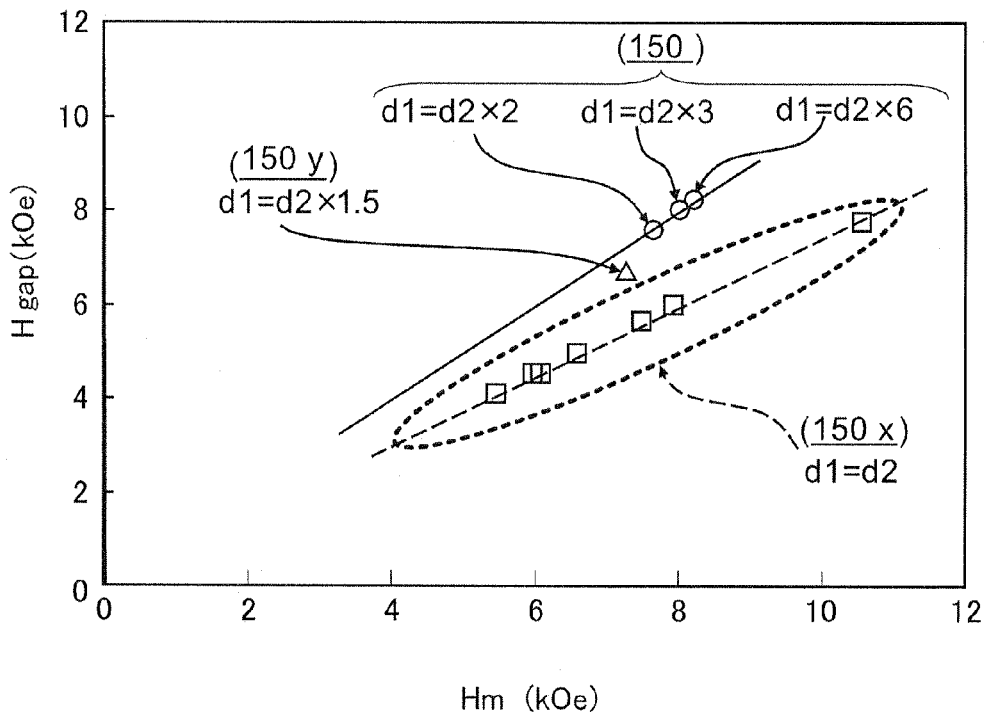
FIG. 3 is a graph illustrating the characteristic of the magnetic recording device.

FIG. 3 is a graph illustrating the characteristic of the magnetic recording device according to the embodiment.

More specifically, this figure illustrates a simulation result of the recording magnetic field Hm and the gap magnetic field Hgap for various designs of the magnetic recording head 5. In this figure, the horizontal axis represents the recording magnetic field Hm, and the vertical axis represents the gap magnetic field Hgap.

This figure shows the characteristic of the magnetic recording device 150 in which the backing layer distance d1 is twice or more (specifically, twice, 3 times, and 6 times) the magnetic recording head gap d2.

Furthermore, this figure also illustrates the characteristic of a magnetic recording device 150*x* of a comparative example for various designs of the magnetic recording head 5 under the condition that the backing layer distance d1 is equal to the magnetic recording head gap d2. Furthermore, this figure also illustrates the characteristic of a magnetic recording device 150*y* of a comparative example in which the backing layer distance d1 is 1.5 times the magnetic recording head gap d2.

As shown in FIG. 3, in the magnetic recording device 150*x* of the comparative example under the condition that the backing layer distance d1 is equal to the magnetic recording head gap d2, even if the design of the magnetic recording head 5 is changed variously, the gap magnetic field Hgap is in proportion to the recording magnetic field Hm. Thus, the gap magnetic field Hgap cannot be controlled independently of the recording magnetic field Hm.

Furthermore, in the magnetic recording device 150*y* of the comparative example in which the backing layer distance d1 is 1.5 times the magnetic recording head gap d2, the gap magnetic field Hgap is larger than the gap magnetic field Hgap in the proportional relationship between the gap magnetic field Hgap and the recording magnetic field Hm in the magnetic recording device 150*x*. However, the difference is relatively small.

In contrast, in the magnetic recording device 150 according to the embodiment in which the backing layer distance d1 is set to twice or more the magnetic recording head gap d2, the gap magnetic field Hgap is considerably larger than the gap magnetic field Hgap in the proportional relationship between the gap magnetic field Hgap and the recording magnetic field Hm in the magnetic recording device 150*x*.

Thus, in the configuration of the magnetic recording device 150 according to the embodiment, apart from the proportional relationship between the gap magnetic field Hgap and the recording magnetic field Hm, the gap magnetic field Hgap can be optimized independently of the recording magnetic field Hm. Furthermore, the recording magnetic field Hm can be optimized independently of the gap magnetic field Hgap. By the optimization of the recording magnetic field Hm, the SN ratio can be increased. That is, by independently optimizing the gap magnetic field Hgap and the recording magnetic field Hm, the SN ratio can be increased.

In perpendicular magnetic recording, the backing layer 82 forms a magnetic circuit together with the main magnetic pole 61 and the shield 62. If the backing layer distance d1 is large so that the medium facing surface 61*a* and the backing layer 82 are distantly separated, then the spacing between the main magnetic pole 61 and the backing layer 82 is widened. This is equivalent to enlarging the nonmagnetic gap of the magnetic circuit.

Thus, in the normal perpendicular magnetic recording (perpendicular magnetic recording not based on the radio frequency assisted recording scheme), if the backing layer distance d1 is large, the overall efficiency of the magnetic circuit decreases, and the writing characteristic is degraded. Hence, in the normal perpendicular magnetic recording, the backing layer distance d1 is designed to be as small as possible.

Also in radio frequency assisted recording, in order to increase the overall efficiency of the magnetic circuit, the backing layer distance d1 is often designed to be as small as possible. On the other hand, the thickness of the spin torque oscillator 10 (the thickness along the stacking direction of the oscillation layer 10*a*, the intermediate layer 22, and the spin injection layer 30) is typically 40-50 nm. Thus, the magnetic recording head gap d2 is 40-50 nm.

For instance, in Non-Patent Document 1, the backing layer distance d1 having a value of 35-40 nm is used. For instance, by comparison with the thickness of the magnetic recording layer 81 and the distance between the magnetic recording layer 81 and the medium facing surface 61*a*, it is estimated from the backing layer distance d1 having a value of 35-40 nm that the backing layer distance d1 is designed to be as small as possible. Furthermore, in Non-Patent Document 1, the magnetic recording head gap d2 is set to 50 nm. That is, in this example, the backing layer distance d1 has a value comparable to the magnetic recording head gap d2. Hence, this example will exhibit the characteristic like the magnetic recording device 150*x* illustrated in FIG. 3.

Thus, within the conventional framework of perpendicular magnetic recording, it is difficult to optimally design each of the stable oscillation of the spin torque oscillator 10 and the writing characteristic on the magnetic recording layer 81.

In contrast, in the configuration of the magnetic recording device 150 according to the embodiment, the backing layer distance d1 is increased. Specifically, the backing layer distance d1 is increased to twice or more the magnetic recording head gap d2. Thus, the optimal writing characteristic can be achieved. That is, even if the overall efficiency of the magnetic circuit is decreased, the optimal writing characteristic can be achieved. This enables radio frequency magnetic field assisted recording with higher SN ratio at reproduction time.

Figure 4:
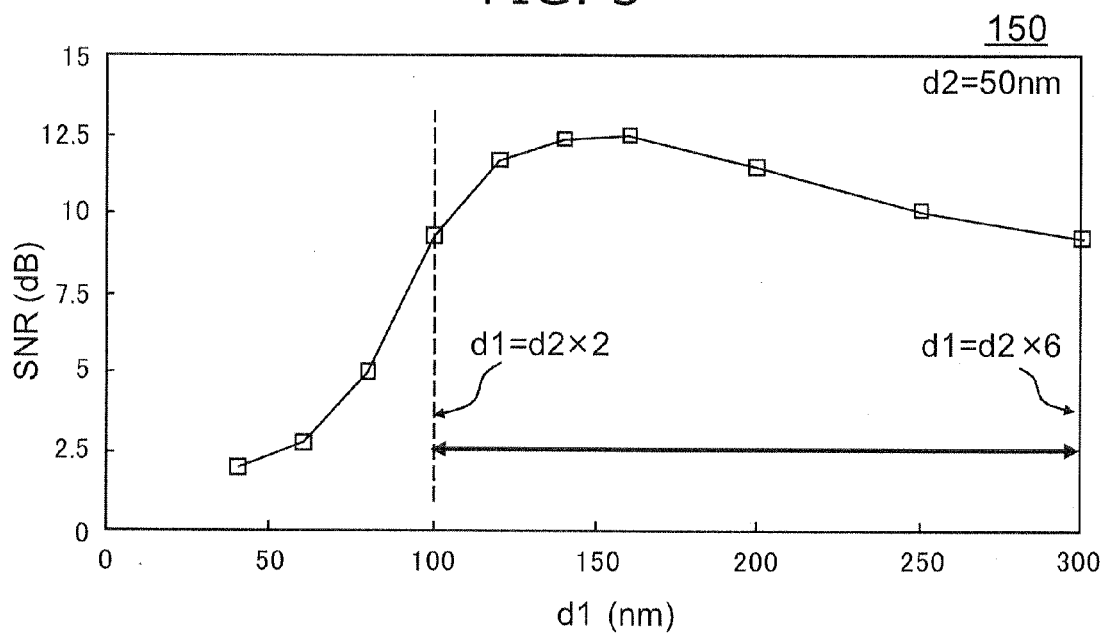
FIG. 4 is a graph illustrating the characteristic of the magnetic recording device.

FIG. 4 is a graph illustrating the characteristic of the magnetic recording device according to the embodiment.

This figure illustrates a simulation result of the SN ratio (SNR) in the magnetic recording device 150 according to the embodiment in which the backing layer distance d1 is changed with the magnetic recording head gap d2 kept constant.

In this simulation, the magnetic recording head gap d2 was set to 50 nm. The medium anisotropic magnetic field Hk of the magnetic recording layer 81 was set to 16 kOe. The thickness of the magnetic recording layer 81 was set to 12 nm. The distance between the magnetic recording head 5 and the magnetic recording layer 81 was set to 11.5 nm. Then, the SN ratio (SNR) was determined in the case where a signal having a linear density of 1200 kBPI (bits/inch$^2$) was written to the magnetic recording layer 81. Here, the thickness of the magnetic recording layer 81 and the distance between the magnetic recording head 5 and the magnetic recording layer 81 were fixed. Hence, by changing the distance between the magnetic recording layer 81 and the backing layer 82 (e.g., the thickness of the seed layer 82a), the backing layer distance d1 was changed.

As shown in FIG. 4, in the magnetic recording device 150 with the magnetic recording head gap d2 being 50 nm, if the backing layer distance d1 is 100 nm or more, the SN ratio (SNR) is high. Thus, the SN ratio (SNR) is high when the backing layer distance d1 is twice or more the magnetic recording head gap d2.

The effect of the embodiment can thus be confirmed. In the following, the reason for the increase of the SN ratio (SNR) by increasing the backing layer distance d1 is described.

In radio frequency assisted recording, in order to generate a radio frequency magnetic field, the resonance phenomenon of the magnetization of the magnetic material of the oscillation layer 10a is used. The stability of this resonance phenomenon is determined by the magnetic field applied from the main magnetic pole 61 to the spin torque oscillator 10. The magnetic field applied from the main magnetic pole 61 to the spin torque oscillator 10 is the gap magnetic field Hgap. The gap magnetic field Hgap is a magnetic field in the gap between the main magnetic pole 61 and the shield 62. The magnitude of the magnetization of the oscillation layer 10a is referred to as oscillation layer magnetization Ms. Then, the normal resonance phenomenon should be affected also by the magnitude of the demagnetizing field (4 $\pi$Ms) of the oscillation layer 10a. However, when the spin torque oscillator 10 is oscillated, the magnetization of the oscillation layer 10a is rotated in a position substantially perpendicular to the magnetic field direction. Hence, the demagnetizing field does not substantially affect the resonance frequency.

The resonance frequency of the oscillation layer 10a also depends on the gap magnetic field Hgap. The resonance frequency of the oscillation layer 10a has the value of the product of the gap magnetic field Hgap and the gyromagnetic ratio $\gamma$. Ferromagnetic resonance in the oscillation layer 10a generates a radio frequency magnetic field for radio frequency assisted recording. That is, in the oscillation layer 10a, a radio frequency magnetic field having a frequency generally equal to $\gamma \times$Hgap is generated.

On the other hand, also in the magnetic recording layer 81, the direction of the magnetization is similarly reversed by the resonance phenomenon of the magnetization of the magnetic material. In the external magnetic field-magnetization curve (MH curve) of the magnetic recording layer 81, the magnetization reversal mechanism of the recording medium at the position where the magnetization vanishes (the position of the so-called coercivity, −Hc) affects most significantly the SN ratio in magnetic recording/reproduction. Thus, the influence of the demagnetizing field at the time of magnetization reversal of the recording medium may be considered as nearly zero. Hence, the resonance frequency of the magnetic recording layer 81 is given by the absolute value of $\gamma \times$(Hk−Hm). Here, the anisotropic magnetic field of the magnetic recording layer 81 is defined as medium anisotropic magnetic field Hk. The magnetic field applied from the main magnetic pole 61 to the magnetic recording layer 81 is defined as recording magnetic field Hm.

In radio frequency assisted recording, the resonance frequency of the oscillation layer 10a and the resonance frequency of the recording medium of the magnetic recording layer 81 are generally matched. That is, the relation Hgap+Hm=Hk approximately holds.

Here, in order to estimate the optimal value of the recording magnetic field Hm, a simulation result of the relationship between the recording magnetic field Hm and the SN ratio (SNR) is described.

Figure 5:
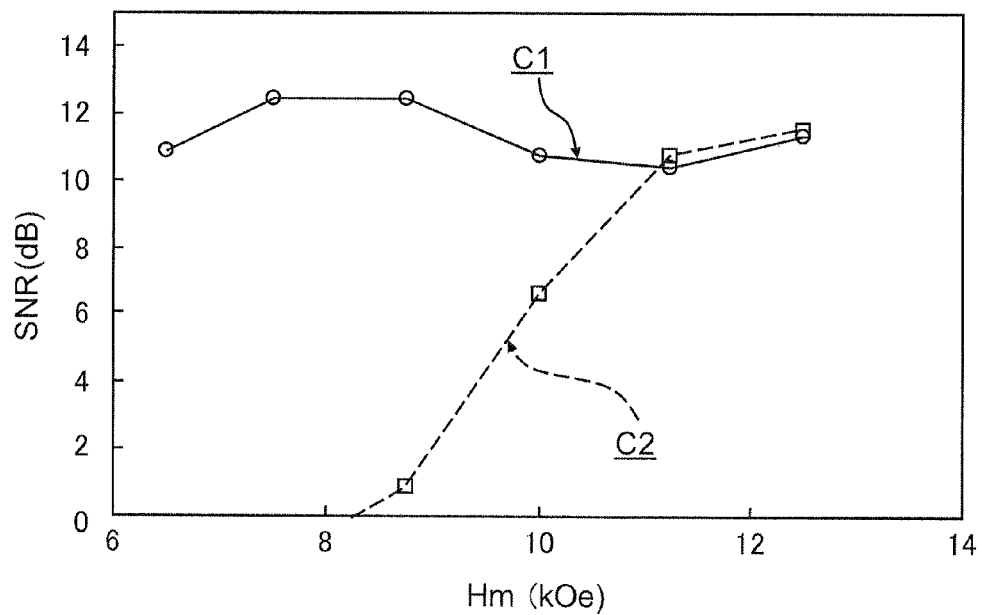
FIG. 5 is a graph illustrating the characteristic of the magnetic recording device.

FIG. 5 is a graph illustrating the characteristic of the magnetic recording device according to the embodiment.

More specifically, this figure illustrates a simulation result of the relationship between the SN ratio and the recording magnetic field Hm in the magnetic recording device 150 according to the embodiment. In this figure, the horizontal axis represents the recording magnetic field Hm, and the vertical axis represents the SN ratio (SNR).

Besides the characteristic C1 in the case of radio frequency assisted recording, this figure also shows together a simulation result of the characteristic C2 in the case of recording on the magnetic recording layer 81 only by the recording magnetic field Hm from the main magnetic pole 61 without performing radio frequency assisted recording.

In this simulation, the recording magnetic field Hm and the gap magnetic field Hgap were not linked. The recording magnetic field Hm and the gap magnetic field Hgap were changed independently. That is, this simulation is different from the actual magnetic recording device in the assumption that a constant radio frequency magnetic field is applied to the magnetic recording layer 81 irrespective of the recording magnetic field Hm.

In the actual magnetic recording device, as described above with reference to FIG. 3, the gap magnetic field Hgap is in proportion to the recording magnetic field Hm even if the parameters of the magnetic recording head 5 are changed. Thus, the gap magnetic field Hgap is almost uniquely determined corresponding to the recording magnetic field Hm. Hence, the effect of radio frequency magnetic field assisted recording should be achieved only when the recording magnetic field Hm corresponds to the gap magnetic field Hgap matched with the oscillation condition of the oscillation layer 10a. However, this simulation assumes that the oscillation layer 10a is oscillated irrespective of the recording magnetic field Hm. Thus, the optimal value for the writing of the recording magnetic field Hm can be found.

Also in this simulation, the medium anisotropic magnetic field Hk of the magnetic recording layer 81 was set to 16 kOe.

As shown in FIG. 5, in the characteristic C2 without radio frequency assisted recording, the SN ratio (SNR) is low when the recording magnetic field Hm is small. In order to achieve high SN ratio (SNR), the recording magnetic field Hm needs to be increased to e.g. approximately 11 kOe.

In contrast, in the characteristic C1 in the case of radio frequency assisted recording, a high SN ratio (SNR) is achieved when the recording magnetic field Hm is 6.5 kOe or more. That is, even if the magnetic field generated from the main magnetic pole 61 is small, the effect of radio frequency assisted recording can be enjoyed.

The SN ratio (SNR) has a particularly high value when the recording magnetic field Hm has a value of approximately 8 kOe. In the simulation illustrated in FIG. 5, the medium anisotropic magnetic field Hk is 16 kOe. Thus, the SN ratio is optimized when the recording magnetic field Hm is approximately half the medium anisotropic magnetic field Hk. Here, when the recording magnetic field Hm is approximately half the medium anisotropic magnetic field Hk corresponds to when recording is completely made impossible without a radio frequency magnetic field.

That is, the condition Hm=0.5×Hk proves to be the optimal condition for the recording magnetic field Hm in the writing of radio frequency assisted recording. Based on this condition and the aforementioned condition for frequency matching, Hgap+Hm=2×Hm follows. Hence, the optimal condition for writing is satisfied when the gap magnetic field Hgap and the recording magnetic field Hm are nearly equal.

As described with reference to FIG. 3, the ratio between the gap magnetic field Hgap and the recording magnetic field Hm does not substantially change even if only the parameters of the magnetic recording head 5 are changed. However, by changing the backing layer distance d1, the ratio between the gap magnetic field Hgap and the recording magnetic field Hm can be changed.

That is, as described with reference to FIG. 3, when the backing layer distance d1 is twice the magnetic recording head gap d2 (which means that the gap magnetic field Hgap and the recording magnetic field Hm are nearly equal), or when the backing layer distance d1 is larger than twice the magnetic recording head gap d2, the writing characteristic is optimized, and the SN ratio (SNR) can be increased.

That is, the oscillation condition is relatively easy to achieve if the condition that the gap magnetic field Hgap and the recording magnetic field Hm are nearly equal (the optimal condition for writing) is satisfied.

Then, as illustrated in FIG. 3, by e.g. adjusting the parameters of the magnetic recording head 5 (such as changing the thickness of the main magnetic pole 61), the value of the gap magnetic field Hgap can be adjusted while keeping the relation of the gap magnetic field Hgap and the recording magnetic field Hm being nearly equal.

For instance, based on the optimal writing condition, the design can be performed so that the oscillation layer 10a is oscillated when the gap magnetic field Hgap is generally equal to 0.5×Hk.

The oscillation of the oscillation layer 10a can be observed by measuring the current flowing through the terminal connected to the oscillator excitation power supply 61p. The spin torque oscillator 10 has the GMR effect simultaneously with being an oscillator. Thus, the occurrence of oscillation in the oscillation layer 10a can be observed by checking the current change at the terminal connected to the oscillator excitation power supply 61p. Specifically, during oscillation, the current at the terminal connected to the oscillator excitation power supply 61p is frequency decomposed. Then, the current has a peak at a certain frequency. For instance, the magnetic field generated in the main magnetic pole 61 is set to half the medium anisotropic magnetic field Hk. The current at the terminal connected to the oscillator excitation power supply 61p is frequency decomposed, and the frequency-decomposed signal is observed. If an oscillation peak is observed in the range of 10-50 GHz, which is the practical oscillation condition of the magnetic recording layer 81, then it turns out that the above oscillation condition is satisfied.

In the characteristic illustrated in FIG. 4, when the backing layer distance d1 is too large, the SN ratio (SNR) is decreased. For instance, when the backing layer distance d1 is larger than approximately 300 nm, that is, when the backing layer distance d1 is larger than approximately 6 times the magnetic recording head gap d2, the SN ratio (SNR) is decreased.

As described with reference to FIG. 5, when the backing layer distance d1 is twice or more the magnetic recording head gap d2, the relation of the gap magnetic field Hgap and the recording magnetic field Hm being nearly equal holds. Thus, the decrease of the SN ratio (SNR) for large backing layer distance d1 is independent of the oscillation condition and the writing optimization. The decrease of the SN ratio (SNR) is attributable to the degradation of the distribution of the recording magnetic field Hm due to the backing layer 82 being excessively distanced from the medium facing surface 61a. Hence, the backing layer distance d1 is preferably 6 times or less the magnetic recording head gap d2.

Figure 6:
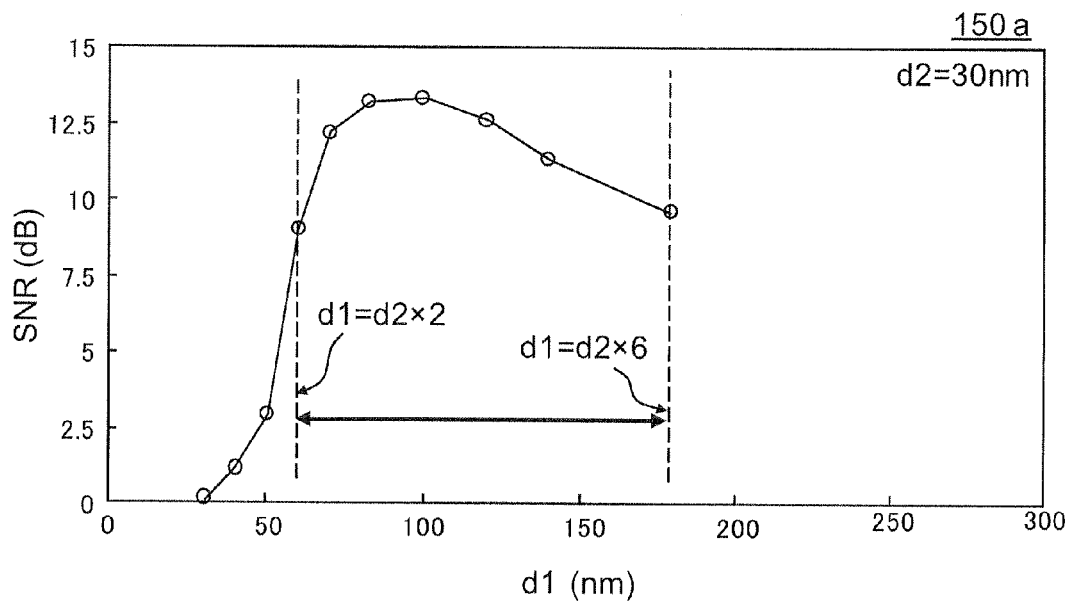
FIG. 6 is a graph illustrating the characteristic of the magnetic recording device.

FIG. 6 is a graph illustrating the characteristic of the magnetic recording device according to the embodiment.

This figure illustrates a simulation result of the SN ratio (SNR) in an alternative magnetic recording device 150a according to the embodiment in which the backing layer distance d1 is changed. The magnetic recording device 150a has the same configuration as the magnetic recording device 150 except the following parameters.

In the magnetic recording device 150a, the magnetic recording head gap d2 was set to 30 nm. The medium anisotropic magnetic field Hk of the magnetic recording layer 81 was set to 18 kOe. The thickness of the magnetic recording layer 81 was set to 10 nm. The distance between the magnetic recording head 5 and the magnetic recording layer 81 was set to 9 nm. Then, the SN ratio (SNR) was determined in the case where a signal having a linear density of 1600 kBPI was written to the magnetic recording layer 81.

As shown in FIG. 6, in the magnetic recording device 150a with the magnetic recording head gap d2 being 30 nm, if the backing layer distance d1 is 60 nm or more, the SN ratio (SNR) is high. Thus, the SN ratio (SNR) is high when the backing layer distance d1 is twice or more the magnetic recording head gap d2.

Thus, also in the magnetic recording device 150a different in parameters from the magnetic recording device 150, the SN ratio (SNR) is high when the backing layer distance d1 is twice or more the magnetic recording head gap d2.

Also in this case, when the backing layer distance d1 is too large, the SN ratio (SNR) is decreased. For instance, when the backing layer distance d1 is larger than approximately 6 times the magnetic recording head gap d2, the SN ratio (SNR) is decreased. Hence, the backing layer distance d1 is preferably 6 times or less the magnetic recording head gap d2.

Figure 7:
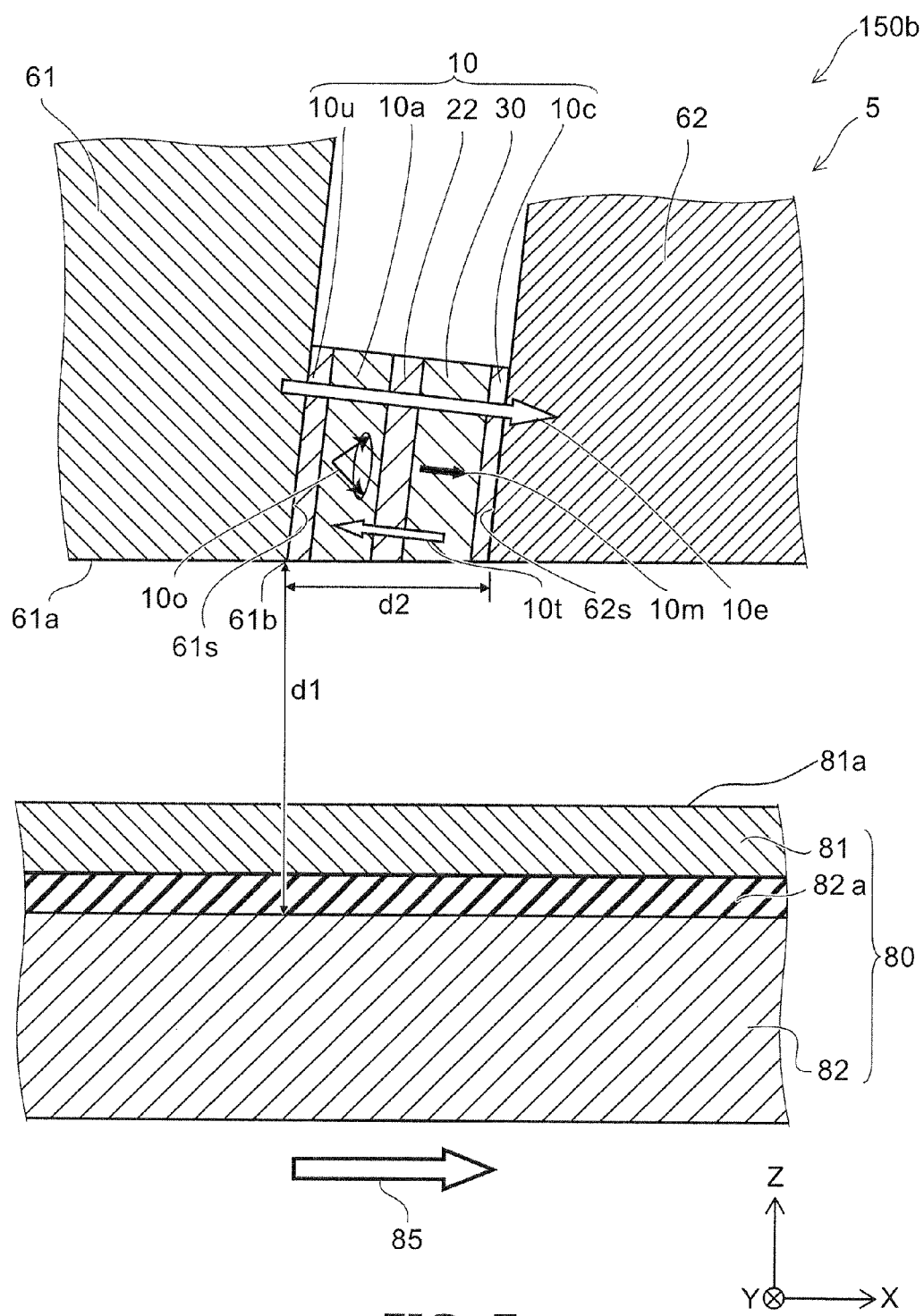
FIG. 7 is a schematic view illustrating the main part configuration of another magnetic recording device.

FIG. 7 is a schematic view illustrating the main part configuration of an alternative magnetic recording device according to the embodiment.

As shown in FIG. 7, in the alternative magnetic recording device 150b according to the embodiment, the stacking direction of the oscillation layer 10a, the intermediate layer 22, and the spin injection layer 30 in the spin torque oscillator 10 is inclined with respect to the Z-axis direction. That is, the stacking direction in the spin torque oscillator 10 is inclined with respect to the surface (major surface 81a) of the magnetic recording layer 81 opposed to the magnetic recording head 5. In this example, a plane including the main magnetic pole side surface 61s makes an acute angle with the major surface 81a.

Thus, the stacking direction in the spin torque oscillator 10 is inclined with respect to the Z-axis direction. This facilitates matching between the region of the magnetic recording layer 81 applied with the radio frequency magnetic field generated by the spin torque oscillator 10 and the region of the magnetic recording layer 81 applied with the recording magnetic field Hm. Thus, the efficiency of radio frequency magnetic field assisted recording is further increased, and the increase of magnetic recording density is further facilitated.

Also in the case where the stacking direction in the spin torque oscillator 10 is inclined with respect to the Z-axis direction, the magnetic recording head gap d2 is the distance along the direction perpendicular to the main magnetic pole side surface 61s between the main magnetic pole side surface 61s of the main magnetic pole 61 opposed to the spin torque oscillator 10 and the shield side surface 62s of the shield 62 opposed to the spin torque oscillator 10. Thus, the magnetic recording head gap d2 is the gap between the main magnetic pole 61 and the shield 62.

Also in this case, the SN ratio (SNR) can be increased by setting the backing layer distance d1 to twice or more the magnetic recording head gap d2.

In the magnetic recording device (e.g., magnetic recording devices 150, 150a, and 150b) according to the embodiment, the main magnetic pole 61 and the shield 62 can be made of a soft magnetic material having relatively high saturation magnetic flux density such as FeCo, CoFe, CoNiFe, NiFe, CoZrNb, FeN, FeSi, and FeAlSi.

In the main magnetic pole 61, the material of the portion on the medium facing surface 61a side and the material of the remaining portion may be different from each other. For instance, in order to increase the magnetic field applied to the magnetic recording medium 80 and the spin torque oscillator 10, the portion on the medium facing surface 61a side may be made of e.g. FeCo, CoNiFe, or FeN having particularly high saturation magnetic flux density, and the remaining portion may be made of e.g. NiFe having particularly high permeability. Furthermore, in order to increase the magnetic field applied to the magnetic recording medium 80 and the spin torque oscillator 10, the size of the cross section (e.g., the cross section cut along the X-Y plane) of the main magnetic pole 61 on the medium facing surface 61a side may be made smaller than the back gap section 64. Then, the magnetic flux concentrates on the portion on the medium facing surface 61a side, and a magnetic field with high intensity can be generated.

The oscillation layer 10a and the spin injection layer 30 can be made of a soft magnetic layer having relatively high saturation magnetic flux density and having magnetic anisotropy in the in-plane direction such as CoFe, CoNiFe, NiFe, CoZrNb, FeN, FeSi, FeAlSi, FeCoAl, FeCoSi, and CoFeB, or a CoCr-based alloy magnetic layer with the magnetization oriented in the in-plane direction such as CoIr.

Furthermore, the oscillation layer 10a and the spin injection layer 30 can be made of a material having good perpendicular orientation with the magnetization oriented in the direction perpendicular to the film surface. Examples can include CoCr-based magnetic layers such as CoCrPt, CoCrTa, CoCrTaPt, and CoCrTaNb, RE-TM amorphous alloy magnetic layers such as TbFeCo, Co-based artificial lattice magnetic layers such as Co/Pd, Co/Pt, Co/Ni, and CoCrTa/Pd, CoPt-based and FePt-based alloy magnetic layers, and SmCo-based alloy magnetic layers.

Furthermore, the oscillation layer 10a and the spin injection layer 30 can also be made of a stacked film including more than one of the above materials. In the case of using a stacked film, the saturation magnetic flux density (Bs) and the anisotropic magnetic field (Hk) of the oscillation layer 10a and the spin injection layer 30 can be easily adjusted.

The oscillation layer 10a can be made of e.g. a film of a high-Bs soft magnetic material (FeCo/NiFe stacked film) having a thickness of 5-20 nm. In this case, for instance, the spin injection layer 30 can be made of a film a CoPt alloy with the magnetization oriented in the perpendicular-to-plane direction and having a thickness of 2-60 nm.

The intermediate layer 22 includes a nonmagnetic material. The intermediate layer 22 can be made of e.g. a nonmagnetic material having high spin transmittance such as Cu, Au, and Ag. The film thickness of the intermediate layer can be set in the range from one atomic layer to approximately 3 nm. This facilitates reducing the exchange coupling between the oscillation layer 10a and the spin injection layer 30.

The element size of the spin torque oscillator 10 (the size of the cross section cut along a plane perpendicular to the stacking direction) is preferably set to 10-100 nm on a side. The element shape is not limited to a rectangular solid, but may be a circular or hexagonal column.

However, the embodiment is not limited to the foregoing. The material used for the oscillation layer 10a, the spin injection layer 30, and the intermediate layer 22, and the size thereof are arbitrary.

The magnetic recording layer 81 is made of e.g. a multi-particle perpendicular magnetic recording material. Furthermore, the radio frequency magnetic field assisted recording scheme is used. This enables use of a material having high magnetic anisotropy energy (Ku) such as FePt and SmCo, which has been difficult to use for writing by conventional magnetic recording heads.

The backing layer 82 can be made of an arbitrary magnetic material.

The seed layer 82a can be made of an arbitrary nonmagnetic material. The seed layer 82a may be either insulative or conductive. The seed layer 82a can be made of various materials such as silicon oxide, Cr, and Ru.

The magnetic recording head 5 may further include a side shield provided opposed to the side surface of at least one of the main magnetic pole 61 and the spin torque oscillator 10, i.e., the surface orthogonal to the arranging direction (e.g., X-axis direction) of the main magnetic pole 61 and the spin torque oscillator 10 and different from the medium facing surface 61a of the main magnetic pole 61. This can suppress the leakage of the recording magnetic field Hm from the main magnetic pole 61 to the adjacent recording track of the magnetic recording medium 80. Furthermore, this can suppress the leakage of the radio frequency magnetic field from the oscillation layer 10a to the adjacent recording track of the magnetic recording medium 80. Thus, the recording track pitch can be made narrower, and the recording density can be further increased. For instance, this side shield may have a configuration integrated with the shield 62.

Figure 8:
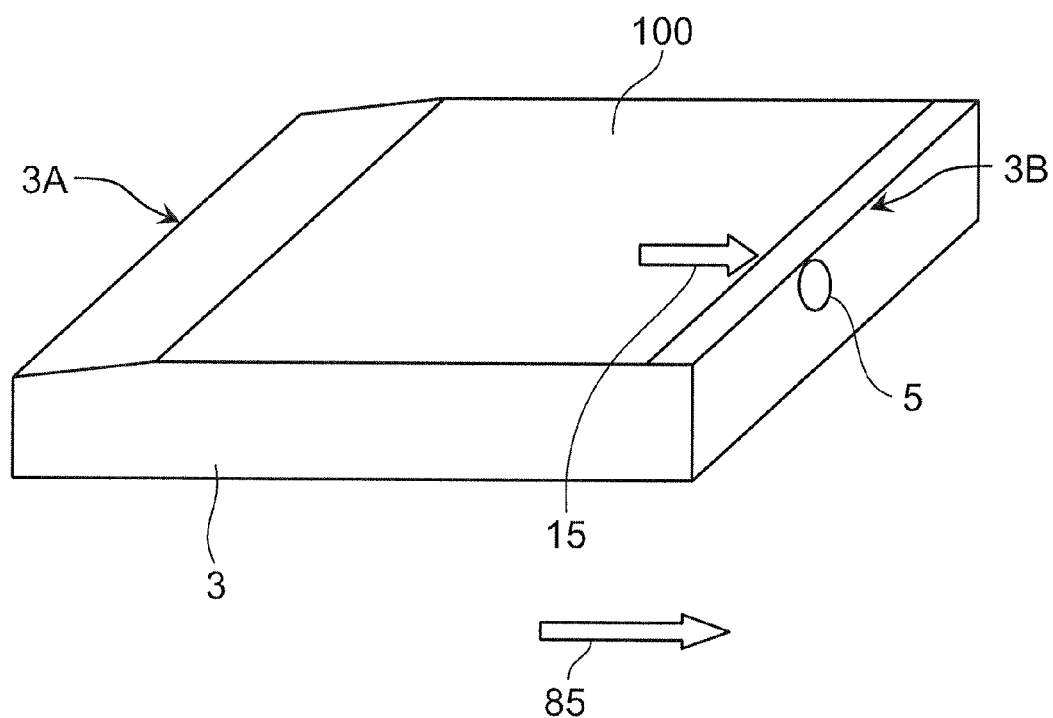
FIG. 8 is a schematic perspective view illustrating a part of the magnetic recording device.

FIG. 8 is a schematic perspective view illustrating the configuration of part of the magnetic recording device according to the embodiment.

More specifically, this figure illustrates the configuration of a head slider 3 installed with the magnetic recording head 5 of the magnetic recording device.

As shown in FIG. 8, the magnetic recording head 5 is installed on the head slider 3. The head slider 3 is made of e.g. $Al_2O_3/TiC$. The head slider 3 is designed and manufactured so as to be able to relatively move on the magnetic recording medium 80 such as a magnetic disk while floating thereabove or being in contact therewith.

The head slider 3 has e.g. an air inflow side 3A and an air outflow side 3B. The magnetic recording head 5 is placed on e.g. the side surface of the air outflow side 3B. Thus, the magnetic recording head 5 installed on the head slider 3 relatively moves on the magnetic recording medium 80 while floating thereabove or being in contact therewith.

In the following, an example of the overall configuration of the magnetic recording device according to the embodiment is described by taking the magnetic recording device 150 as an example.

The magnetic recording device 150 is a magnetic recording device suitable to realize data storage with high recording density, high recording capacity, and high data transfer rate. The magnetic recording device 150 is e.g. a magnetic recording/reproducing device of the recording/reproduction integrated type. However, the magnetic recording device 150 can have only the recording function, or can have both the recording function and the reproducing function.

Figure 9:
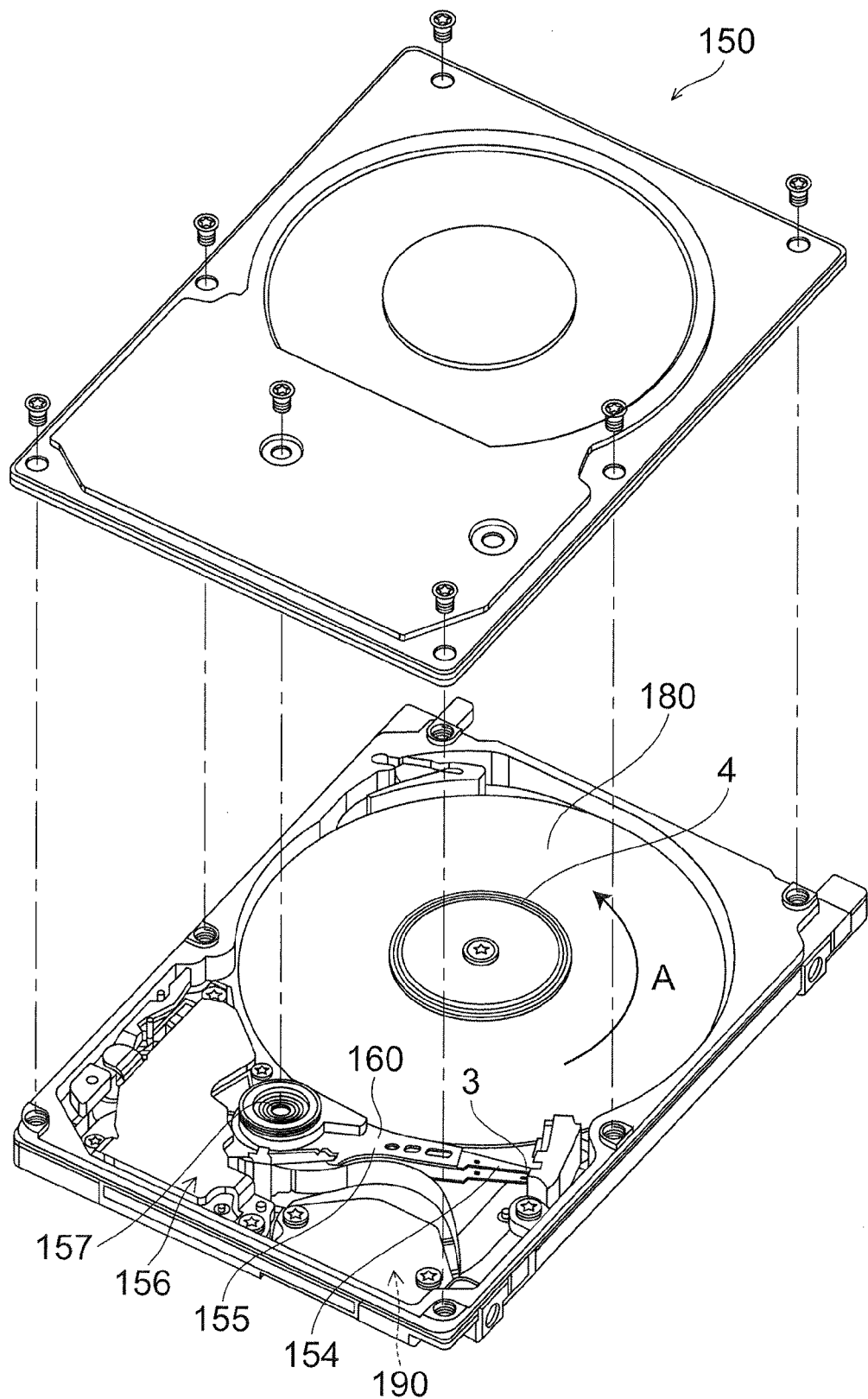
FIG. 9 is a schematic perspective view illustrating the magnetic recording device.

FIG. 9 is a schematic perspective view illustrating the configuration of the magnetic recording device according to the embodiment.

Figure 10A:
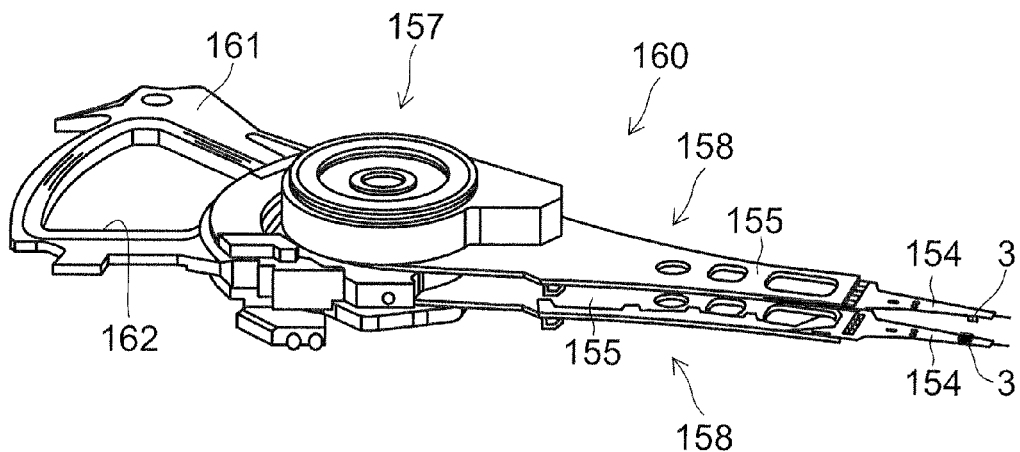
FIGS. 10A and 10B are schematic perspective views illustrating a part of the magnetic recording device.
Figure 10B:
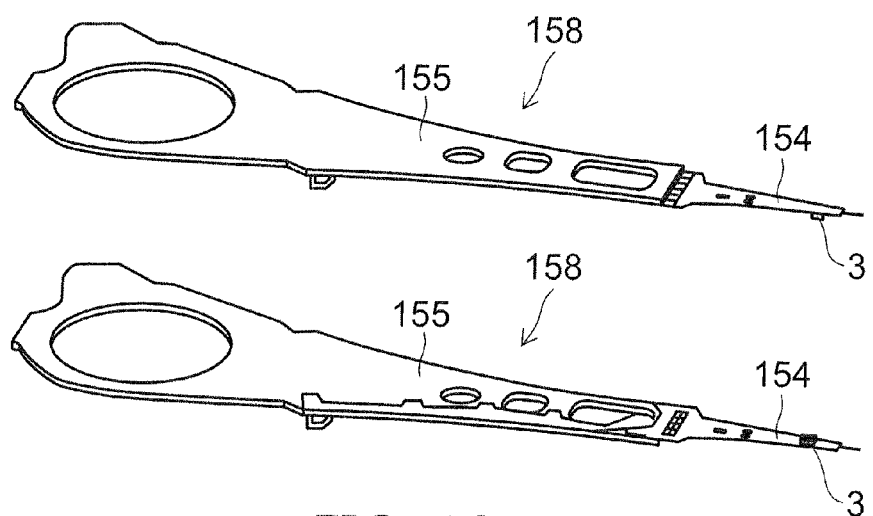

FIGS. 10A and 10B are schematic perspective views illustrating the configuration of part of the magnetic recording device according to the embodiment.

More specifically, FIG. 10A shows an enlarged view of a head stack assembly 160 included in the magnetic recording device 150. FIG. 10B illustrates a magnetic head assembly (head gimbal assembly) 158, which constitutes part of the head stack assembly 160.

As shown in FIG. 9, the magnetic recording device 150 is a device based on a rotary actuator. A recording medium disk 180 is mounted on a spindle motor 4 and rotated in the direction of arrow A by a motor, not shown, in response to a control signal from a drive controller, not shown. The magnetic recording device 150 may include a plurality of recording medium disks 180.

The head slider 3 for recording/reproducing information stored on the recording medium disk 180 is attached to the tip of a thin-film suspension 154.

When the recording medium disk 180 is rotated, the pressing pressure by the suspension 154 is balanced with the pressure generated at the medium facing surface of the head slider 3. Thus, the medium facing surface of the head slider 3 is held at a prescribed floating amount from the surface of the recording medium disk 180. Here, the head slider 3 may be of the so-called "contact-traveling type", in which the head slider 3 is in contact with the recording medium disk 180.

The suspension 154 is connected to one end of an actuator arm 155 including e.g. a bobbin for holding a driving coil, not shown. A voice coil motor 156, which is a kind of linear motor, is provided on the other end of the actuator arm 155. The voice coil motor 156 includes the driving coil, not shown, wound up around the bobbin of the actuator arm 155, and a magnetic circuit composed of a permanent magnet and an opposed yoke opposed across this coil.

The actuator arm 155 is held by ball bearings, not shown, provided at two positions, top and bottom, of a bearing portion 157, so that the actuator arm 155 can be slidably rotated by the voice coil motor 156. As a result, the magnetic recording head 5 can be moved to an arbitrary position on the recording medium disk 180.

As shown in FIG. 10A, the head stack assembly 160 includes a bearing portion 157, a head gimbal assembly 158 extending from this bearing portion 157, and a support frame 161 extending from the bearing portion 157 to the direction opposite from the head gimbal assembly 158 and supporting the coil 162 of the voice coil motor.

As shown in FIG. 10B, the head gimbal assembly 158 includes an actuator arm 155 extending from the bearing portion 157, and a suspension 154 extending from the actuator arm 155. To the tip of the suspension 154, the head slider 3 is attached.

In the specific example, two head gimbal assemblies 158 are provided. However, the number of head gimbal assemblies 158 may be one.

Thus, the magnetic head assembly (head gimbal assembly) 158 includes the magnetic recording head 5, a head slider 3 with the magnetic recording head 5 installed thereon, a suspension 154 with the head slider 3 installed on one end, and an actuator arm 155 connected to the other end of the suspension 154.

The suspension 154 includes lead wires (not shown) such as for writing and reading signals, for a heater for adjusting the floating amount, and for the spin torque oscillator 10. These lead wires are electrically connected to respective electrodes of the magnetic recording head 5 incorporated in the head slider 3.

As shown in FIG. 9, a signal processing unit 190 is provided to write and read signals on the magnetic recording medium 80 using the magnetic recording head 5. For instance, the signal processing unit 190 is provided on the rear surface side, as viewed in FIG. 9, of the magnetic recording device 150 illustrated in FIG. 9. The input/output lines of the signal processing unit 190 are connected to the electrode pads of the head gimbal assembly 158 and electrically coupled to the magnetic recording head.

Thus, in addition to the magnetic recording medium 80 and the magnetic recording head 5, the magnetic recording device 150 according to the embodiment can further include a movable unit for relatively moving the magnetic recording medium 80 and the magnetic recording head 5 while the magnetic recording medium 80 and the magnetic recording head 5 are opposed to each other in a spaced or contact state. The magnetic recording device 150 can further include a position control unit for positioning the magnetic recording head 5 at a prescribed recording position on the magnetic recording medium 80. The magnetic recording device 150 can further include a signal processing unit 190 for writing and reading signals on the magnetic recording medium using the magnetic recording head 5.

More specifically, the above magnetic recording medium 80 can be the recording medium disk 180. The above movable unit can include the head slider 3. The above signal processing unit can include the head gimbal assembly 158.

As described above, in the magnetic recording device 150, the spin torque oscillator 10 can be provided on the trailing side of the main magnetic pole 61. In this case, each site of the magnetic recording layer 81 subjected to magnetic recording is first opposed to the main magnetic pole 61, and then opposed to the spin torque oscillator 10.

Alternatively, the spin torque oscillator 10 may be provided on the leading side of the main magnetic pole 61. In this case, each site of the magnetic recording layer 81 is first opposed to the spin torque oscillator 10, and then opposed to the main magnetic pole 61.

In the following, examples of the magnetic recording medium 80 used in the magnetic recording device 150 are described.

Figure 11A:
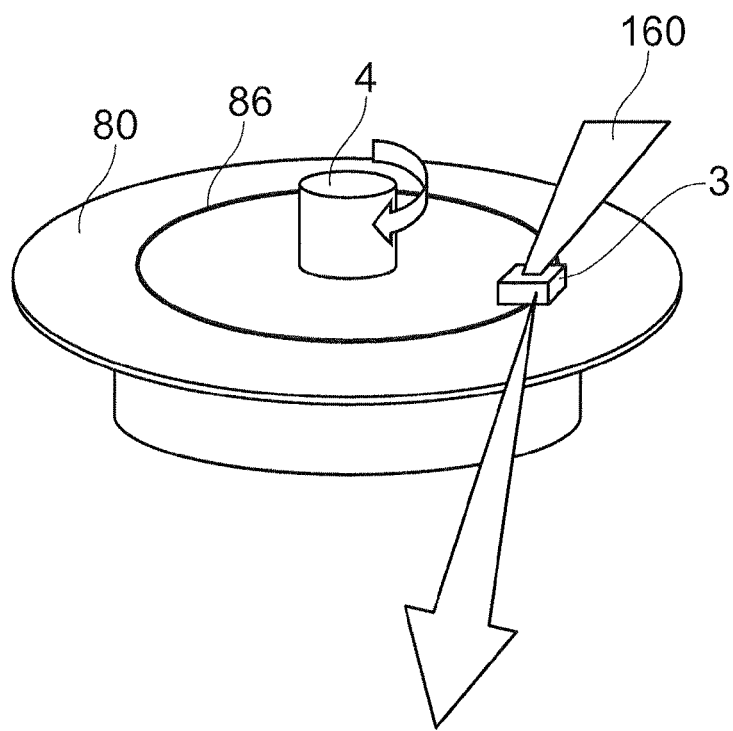
FIGS. 11A and 11B are schematic views illustrating a magnetic recording medium of the magnetic recording device.
Figure 11B:
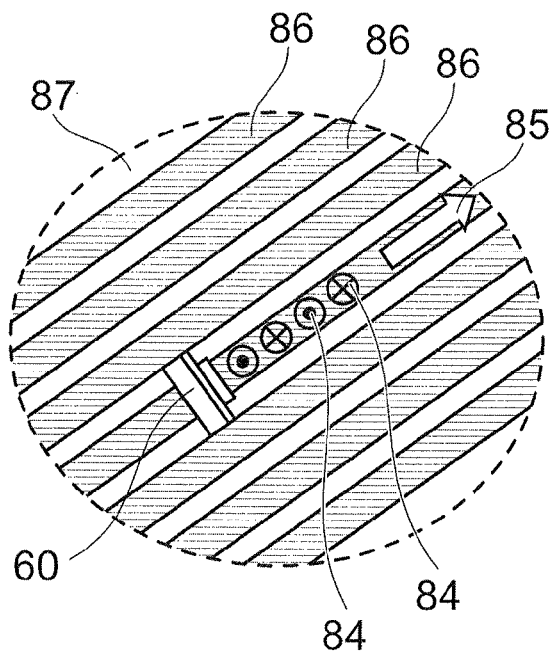

FIGS. 11A and 11B are schematic views illustrating the configuration of a magnetic recording medium of the magnetic recording device according to the embodiment.

More specifically, FIG. 11A is a schematic perspective view illustrating the configuration of the magnetic recording medium 80. The head slider 3 is also illustrated together. FIG. 11B is a schematic plan view illustrating the configuration of the magnetic recording medium 80, where the magnetic recording medium 80 is enlarged as viewed in the Z-axis direction.

As shown in FIGS. 11A and 11B, the magnetic recording medium 80 used in the magnetic recording device 150 includes perpendicularly oriented, multiparticle magnetic discrete tracks (recording tracks) 86 separated from each other by a nonmagnetic material (or air) 87.

This magnetic recording medium 80 is rotated by a spindle motor 4. Each position of the magnetic recording medium 80 is moved toward the medium travel direction 85 and sequentially opposed to the magnetic recording head 5 installed on the head slider 3. Thus, by the combination of the magnetic recording head 5 and the backing layer 82, a recording magnetization 84 is formed in the magnetic recording medium 80.

Thus, the magnetic recording medium 80 used in the magnetic recording device 150 can be a discrete track medium in which adjacent recording tracks are formed via a nonmagnetic portion.

The width (TS) of the spin torque oscillator 10 in the width direction of the recording track can be set to more than or equal to the width (TW) of the recording track 86 and less than or equal to the recording track pitch (TP). This can significantly suppress the decrease of coercivity in adjacent recording tracks due to the leakage radio frequency magnetic field generated from the spin torque oscillator 10. Hence, in the magnetic recording medium 80 of the specific example, only the target recording track 86 can be effectively subjected to radio frequency magnetic field assisted recording.

According to the specific example, a radio frequency assisted recording device with narrow recording tracks, i.e., high recording track density, is realized more easily than in the case of using a multiparticle perpendicular medium made of a so-called "blanket film". Furthermore, radio frequency magnetic field assisted recording can be used in conjunction with a magnetic medium material having high magnetic anisotropy energy (Ku) such as FePt and SmCo, which has been difficult to use for writing by conventional magnetic recording heads. This can further miniaturize magnetic medium particles to the size of nanometers. Thus, it is possible to realize a magnetic recording device having far higher linear recording density than conventional also in the linear recording density direction (bit direction).

In the magnetic recording device 150 according to the embodiment, recording can be reliably performed also on the magnetic recording layer having high coercivity in a discrete-type magnetic recording medium 80. This enables magnetic recording with high density and high speed.

Figure 12A:
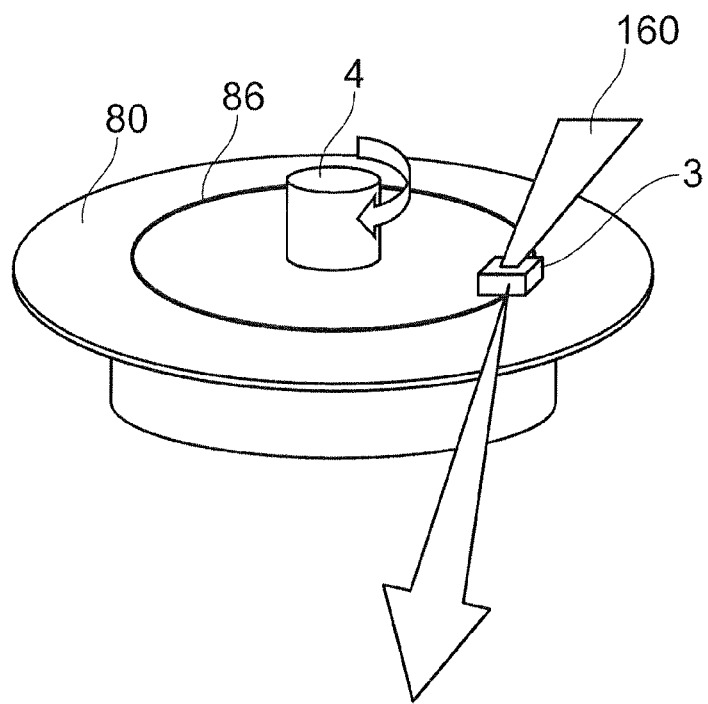
FIGS. 12A and 12B are schematic views illustrating another magnetic recording medium of the magnetic recording device.
Figure 12B:
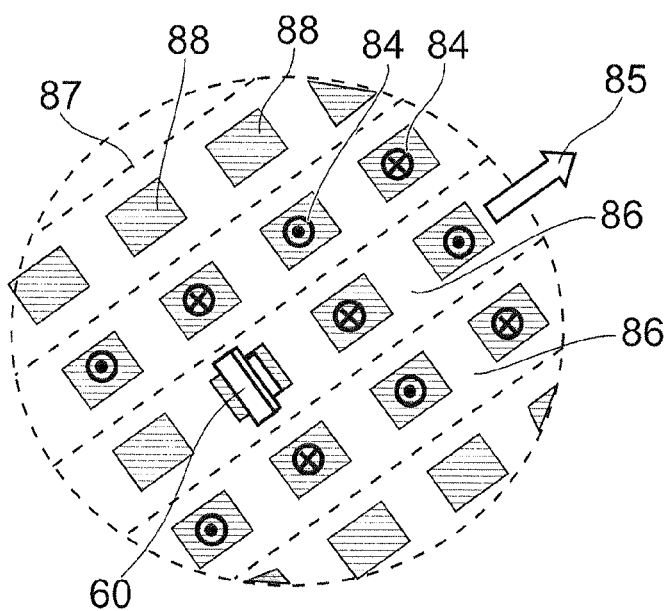

FIGS. 12A and 12B are schematic views illustrating the configuration of an alternative magnetic recording medium of the magnetic recording device according to the embodiment.

More specifically, FIG. 12A is a schematic perspective view illustrating the configuration of the magnetic recording medium 80. The head slider 3 is also illustrated together. FIG. 12B is a schematic plan view illustrating the configuration of the magnetic recording medium 80, where the magnetic recording medium 80 is enlarged as viewed in the Z-axis direction.

As shown in FIGS. 12A and 12B, the alternative magnetic recording medium 80 that can be used in the magnetic recording device 150 includes magnetic bit patterns 88 separated from each other by a nonmagnetic material 87.

This magnetic recording medium 80 is rotated by a spindle motor 4. Each position of the magnetic recording medium 80 is moved toward the medium travel direction 85 and sequentially opposed to the magnetic recording head 5 installed on the head slider 3. Thus, by the combination of the magnetic recording head 5 and the backing layer 82, a recording magnetization 84 is formed in the magnetic recording medium 80.

Thus, the alternative magnetic recording medium 80 used in the magnetic recording device 150 can be a bit-patterned medium (discrete bit medium) in which isolated recording magnetic dots are regularly arranged via a nonmagnetic portion.

In the magnetic recording device 150 including such a magnetic recording medium 80, recording can be reliably performed also on the magnetic recording layer having high coercivity in a discrete-type magnetic recording medium 80. This enables magnetic recording with high density and high speed.

Also in the specific example, the width (TS) of the spin torque oscillator 10 in the width direction of the recording track can be set to more than or equal to the width (TW) of the recording track 86 and less than or equal to the recording track pitch (TP). This can significantly suppress the decrease of coercivity in adjacent recording tracks due to the leakage radio frequency magnetic field generated from the spin torque oscillator 10. Hence, only the target recording track 86 can be effectively subjected to radio frequency magnetic field assisted recording. According to the specific example, by miniaturizing the magnetic bit pattern 88 and increasing its magnetic anisotropy energy (Ku), there is a possibility of realizing a radio frequency magnetic field assisted recording device having a recording density of 10 TBPI (tera BPI) or more as long as thermal fluctuation resistance under the operating environment can be maintained.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

The embodiment of the invention has been described with reference to examples. However, the invention is not limited to these examples. For instance, any specific configuration of the component constituting the magnetic recording device such as the magnetic recording medium, magnetic recording head, main magnetic pole, shield, stacked structure, first magnetic layer, second magnetic layer, intermediate layer, magnetic recording layer, backing layer, spin torque oscillator, oscillation layer, and spin injection layer can be variously modified in shape, size, material, and layout by those skilled in the art. Such modifications are also encompassed within the scope of the invention as long as those skilled in the art can similarly practice the invention and achieve similar effects by suitably selecting such configuration from conventionally known ones.

Further, any two or more components of the specific examples may be combined within the extent of technical feasibility and are included in the scope of the invention to the extent that the purport of the invention is included.

Furthermore, those skilled in the art can suitably modify and implement the magnetic recording device described above in the embodiment of the invention. All the magnetic recording devices thus modified are also encompassed within the scope of the invention as long as they fall within the spirit of the invention.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic recording device comprising:
   a magnetic recording head including:
      a main magnetic pole having a medium facing surface and a main magnetic pole side surface intersecting the medium facing surface, a main magnetic pole including a soft magnetic material, and configured to generate a recording magnetic field;
a shield having a shield side surface facing the main magnetic pole side surface;
a stacked structure provided between the main magnetic pole and the shield,
the stacked structure including:
a first magnetic layer;
a second magnetic layer; and
an intermediate layer provided between the first magnetic layer and the second magnetic layer and including a nonmagnetic material; and
a magnetic recording medium including:
a backing layer including a soft magnetic material and forming a magnetic circuit together with the main magnetic pole and the shield; and
a magnetic recording layer provided between the backing layer and the magnetic recording head, having a major surface, the major surface facing the medium facing surface and the shield, and subjected to perpendicular magnetic recording by the recording magnetic field,
a first distance along a direction perpendicular to the major surface between an end portion of the medium facing surface on a side of the stacked structure and the backing layer being twice or more of a second distance along a direction perpendicular to the main magnetic pole side surface between the main magnetic pole side surface and the shield side surface.

2. The device according to claim 1, wherein the first distance is 6 times or less the second distance.

3. The device according to claim 2, wherein the shield is disposed on a trailing side of the main magnetic pole.

4. The device according to claim 3, wherein the magnetic recording medium is a discrete track medium having adjacent recording tracks formed via a nonmagnetic member.

5. The device according to claim 3, wherein the magnetic recording medium is a bit-patterned medium having isolated recording magnetic dots regularly arranged via a nonmagnetic member.

6. The device according to claim 1, wherein a product of an anisotropy energy constant of the first magnetic layer and a volume of the first magnetic layer is smaller than a product of anisotropy energy of the second magnetic layer and a volume of the second magnetic layer.

7. The device according to claim 1, wherein a coercivity of the first magnetic layer is smaller than the recording magnetic field applied to the first magnetic layer.

8. The device according to claim 1, wherein a coercivity of the second magnetic layer is smaller than the recording magnetic field applied to the second magnetic layer.

9. The device according to claim 1, wherein a current is possible to be supplied to the stacked structure through the main magnetic pole and the shield.

10. The device according to claim 1, further comprising an oscillator excitation power supply configured to supply a current to the stacked structure through the main magnetic pole and the shield.

11. The device according to claim 1, wherein
the stacked structure further includes a foundation layer and a capping layer,
the first magnetic layer is disposed between the intermediate layer and the foundation layer, and
the second magnetic layer is disposed between the intermediate layer and the capping layer.

12. The device according to claim 1, wherein the first magnetic layer is disposed between the main magnetic pole and the second magnetic layer.

13. The device according to claim 1, wherein the second magnetic layer is disposed between the main magnetic pole and the first magnetic layer.

14. The device according to claim 1, further comprising a main magnetic pole excitation coil configured to generate the recording magnetic field on the main magnetic pole by exciting the main magnetic pole.

15. The device according to claim 1, wherein a stacking direction of the first magnetic layer, the intermediate layer and the second magnetic layer is inclined with respect to the major surface.

16. The device according to claim 1, wherein a plane including the main magnetic pole side surface makes an acute angle with the major surface.

17. The device according to claim 1, wherein the first distance is 60 nanometers or more.

18. The device according to claim 1, wherein the magnetic recording layer includes a multiparticle perpendicular magnetic recording material.

19. The device according to claim 1, wherein the magnetic recording layer includes at least one of FePt and SmCo.

20. The device according to claim 1, wherein the magnetic recording layer further includes a seed layer provided between the magnetic recording layer and the backing layer.

* * * * *